United States Patent
Chun et al.

(10) Patent No.: US 9,402,315 B2
(45) Date of Patent: Jul. 26, 2016

(54) SEMICONDUCTOR PACKAGE HAVING MAGNETIC CONNECTION MEMBER

(71) Applicant: SAMSUNG ELECTRONICS CO., LTD., Suwon-si, Gyeonggi-do (KR)

(72) Inventors: Hyunsuk Chun, Gyeonggi-do (KR);
Soojae Park, Gyeonggi-do (KR);
Seungbae Lee, Gyeonggi-do (KR);
Sangsu Ha, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/457,493

(22) Filed: Aug. 12, 2014

(65) Prior Publication Data

US 2015/0115468 A1 Apr. 30, 2015

(30) Foreign Application Priority Data

Oct. 29, 2013 (KR) .................. 10-2013-0129374

(51) Int. Cl.
*H05K 1/18* (2006.01)
*H05K 1/11* (2006.01)
(Continued)

(52) U.S. Cl.
CPC ............ *H05K 1/18* (2013.01); *H01L 23/5226* (2013.01); *H01L 23/562* (2013.01); *H01L 24/13* (2013.01); *H01L 24/81* (2013.01); *H01L 25/0657* (2013.01); *H01L 25/105* (2013.01); *H01L 25/50* (2013.01); *H05K 1/11* (2013.01); *H01L 24/16* (2013.01); *H01L 24/32* (2013.01); *H01L 24/48* (2013.01); *H01L 24/73* (2013.01); *H01L 2224/0401* (2013.01); *H01L 2224/0557* (2013.01); *H01L 2224/10135* (2013.01); *H01L 2224/10165* (2013.01); *H01L 2224/131* (2013.01); *H01L 2224/13014* (2013.01); *H01L 2224/13025* (2013.01); *H01L 2224/13147* (2013.01); *H01L 2224/16145* (2013.01);
(Continued)

(58) Field of Classification Search
CPC .......... H05K 1/18; H05K 1/11; H01L 25/065; H01L 23/5226
See application file for complete search history.

(56) References Cited

U.S. PATENT DOCUMENTS 7,332,423 B2 * 2/2008 Starkston .............. H01L 21/563
257/E21.503
8,076,762 B2 12/2011 Chandrasekaran et al.
(Continued)

FOREIGN PATENT DOCUMENTS

JP 2012069772 4/2012
KR 1020020077713 10/2002
(Continued)

*Primary Examiner* — Peniel M Gumedzoe
(74) *Attorney, Agent, or Firm* — F. Chau & Associates, LLC

(57) ABSTRACT

Provided is a semiconductor package including a wiring substrate having top and bottom surfaces. A first semiconductor chip is disposed on the wiring substrate in a flip-chip manner. The first semiconductor chip has a first surface facing the top surface of the wiring substrate and a second surface opposite to the first surface. First connection members are disposed between the wiring substrate and the first semiconductor chip. The first connection members include first and second contact members each including one or more magnetic materials. The first contact members include portions disposed in the second contact members. The one or more magnetic material of the first contact members have an opposite polar orientation to that of the second contact members.

5 Claims, 14 Drawing Sheets

(51) Int. Cl.
*H01L 23/522* (2006.01)
*H01L 25/065* (2006.01)
*H01L 23/00* (2006.01)
*H01L 25/10* (2006.01)
*H01L 25/00* (2006.01)

(52) U.S. Cl.
CPC ............... *H01L2224/16146* (2013.01); *H01L 2224/16227* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/81121* (2013.01); *H01L 2224/81141* (2013.01); *H01L 2224/81815* (2013.01); *H01L 2225/0651* (2013.01); *H01L 2225/06513* (2013.01); *H01L 2225/06517* (2013.01); *H01L 2225/06541* (2013.01); *H01L 2225/06565* (2013.01); *H01L 2225/06568* (2013.01); *H01L 2225/1023* (2013.01); *H01L 2225/1058* (2013.01); *H01L 2924/15311* (2013.01); *H01L 2924/15312* (2013.01); *H01L 2924/15331* (2013.01); *H01L 2924/181* (2013.01); *H01L 2924/18161* (2013.01); *H01L 2924/3511* (2013.01)

(56) References Cited

U.S. PATENT DOCUMENTS

| 8,299,596 | B2 | 10/2012 | Huang et al. |
| 2004/0046248 | A1 | 3/2004 | Waelti et al. |
| 2006/0284309 | A1* | 12/2006 | Park ................. H01L 23/49816 257/731 |
| 2008/0315386 | A1* | 12/2008 | Kudo ................... H01L 25/105 257/686 |
| 2009/0051046 | A1* | 2/2009 | Yamazaki ........... H01L 21/6835 257/777 |
| 2011/0291246 | A1 | 12/2011 | Jo et al. |
| 2012/0299183 | A1 | 11/2012 | Fujisawa |
| 2012/0313236 | A1* | 12/2012 | Wakiyama ........... H01L 23/544 257/734 |

FOREIGN PATENT DOCUMENTS

| KR | 1020070040869 | 4/2007 |
| KR | 1020080107589 | 12/2008 |
| KR | 1020120048840 | 5/2012 |

\* cited by examiner

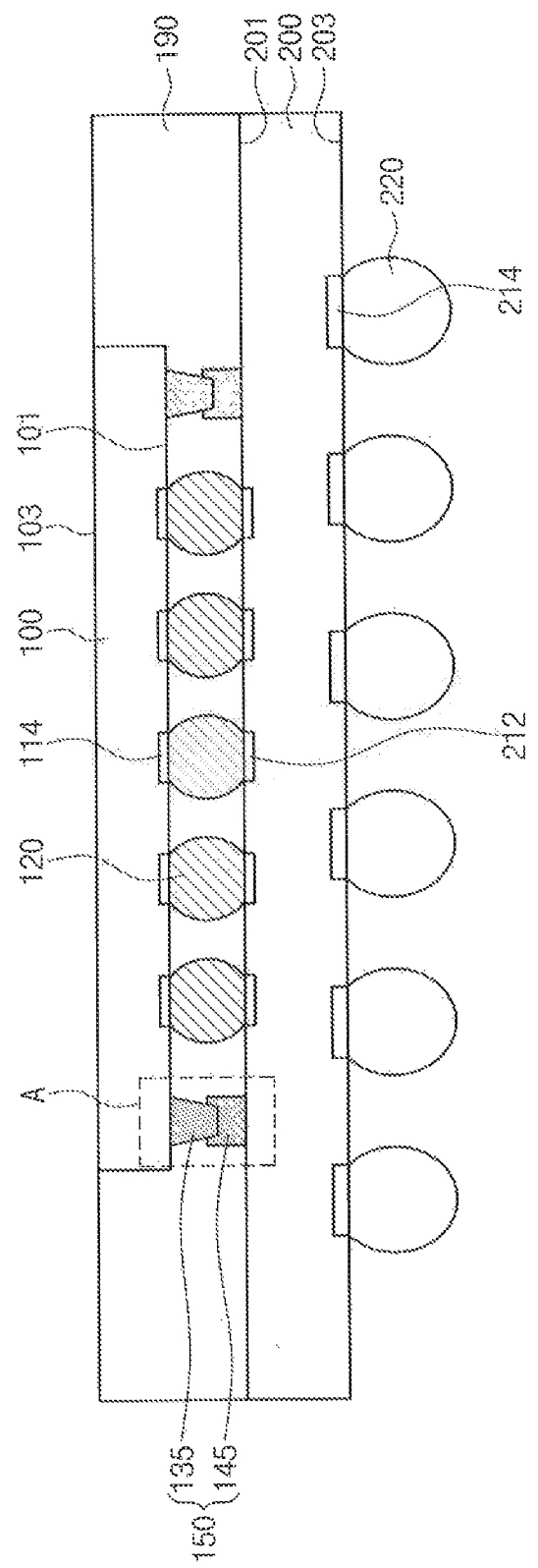

SEMICONDUCTOR PACKAGE HAVING MAGNETIC CONNECTION MEMBER

CROSS-REFERENCE TO RELATED APPLICATION

This U.S. non-provisional patent application claims priority under 35 U.S.C. §119 to Korean Patent Application No. 10-2013-0129374, filed on Oct. 29, 2013, in the Korean Intellectual Property Office, the disclosure of which is incorporated by reference herein in its entirety.

TECHNICAL FIELD

Exemplary embodiments of the present inventive concept relate to a semiconductor package, and more particularly to a semiconductor package having a magnetic connection member.

DISCUSSION OF RELATED ART

Small and slim printed circuit boards (PCBs) may be used with electronic devices having thinner, lighter, smaller, slimmer and higher packing density. For example, a substrate for PCBs may be thin and a package product may be slim. However, warpage of a semiconductor package may occur, because of a difference in a thermal expansion coefficient between a semiconductor chip, an epoxy molding compound, and a package substrate. Warpage of the semiconductor package may result in interconnection failure of the semiconductor chip, and thus, reliability of the semiconductor package may be reduced. Warpage of the semiconductor package may result in a vacuum error or a delivery failure in a packaging process.

SUMMARY

Exemplary embodiments of the present inventive concept provide a semiconductor package with decreased warpage and increased reliability.

According to exemplary embodiments of the present inventive concept, a semiconductor package includes a wiring substrate having top and bottom surfaces. A first semiconductor chip is disposed on the wiring substrate in a flip-chip manner. The first semiconductor chip has a first surface facing the top surface of the wiring substrate and a second surface opposite to the first surface. First connection members are disposed between the wiring substrate and the first semiconductor chip. The first connection members include first and second contact members each containing magnetic materials. The first contact members may include portions disposed in the second contact members. The one or more magnetic material of the first contact members have an opposite polar orientation to that of the second contact members.

According to exemplary embodiments of the present inventive concept, the first contact members may include two end portions, which are opposite to each other, and one of which is in contact with a corresponding one of the second contact members. One end portion of the first contact member may have a width smaller than that of the other end portion. The second contact members may have a recess, in which one of the end portions of the corresponding one of the first contact members is disposed.

According to exemplary embodiments of the present inventive concept, each of the first contact members may include a central portion and a protruding portion extending from the central portion. The protruding portion has a width smaller than that of the central portion. Each of the second contact members has a recess, in which the protruding portion of the first contact members is disposed.

According to exemplary embodiments of the present inventive concept, the connection members may be disposed adjacent to corners of the first semiconductor chip. The corners may be defined by adjacent sides of the first semiconductor chip.

According to exemplary embodiments of the present inventive concept the connection members are disposed along sides of the first semiconductor chip.

According to exemplary embodiments of the present inventive concept, the semiconductor package may include a second semiconductor chip stacked on the first semiconductor chip. Each of the first and second semiconductor chips may include through electrodes and the second semiconductor chip may be electrically connected to the wiring substrate via the through electrodes.

According to exemplary embodiments of the present inventive concept, the semiconductor package may include second connection members disposed between the first and second semiconductor chips. The second connection members may be in line with the first connection members when viewed in plan view.

According to exemplary embodiments of the present inventive concept, the semiconductor package may include a main board disposed below the wiring substrate. Third connection members may be disposed between the main board and the wiring substrate. The main board may be electrically connected to the wiring substrate via one or more outer connection terminals disposed on the bottom surface of the wiring substrate.

According to exemplary embodiments of the present inventive concept the third connection members may be disposed adjacent to corners of the wiring substrate. The corners may be defined by adjacent sides of the wiring substrate.

According to exemplary embodiments of the present inventive concept the third connection members may be disposed along sides of the wiring substrate.

According to exemplary embodiments of the present inventive concept, a semiconductor package may include a first semiconductor package including a lower wiring substrate and a first semiconductor chip disposed on the lower wiring substrate. A second semiconductor package is disposed on the first semiconductor package. The second semiconductor package includes an upper wiring substrate and a second semiconductor chip disposed on the upper wiring substrate. First connection members are disposed between the first and second semiconductor packages. The first connection members include first and second contact members each including one or more magnetic materials. The first contact members include portions disposed in the second contact members. The one or more magnetic material of the first contact members have an opposite polar orientation to that of the second contact members.

According to exemplary embodiments of the present inventive concept the first connection members may be disposed along sides of the lower wiring substrate or may be disposed adjacent to corners of the lower wiring substrate. The corners may be defined by adjacent sides of the lower wiring substrate.

According to exemplary embodiments of the present inventive concept, the semiconductor package may include a main board disposed below the lower wiring substrate. Second connection members may be disposed between the main board and the lower wiring substrate. The main board may be electrically connected to the lower wiring substrate via one or more outer connection terminal disposed on a bottom surface of the lower wiring substrate.

According to exemplary embodiments of the present inventive concept the second connection members may be in line with the first connection members when viewed in plan view.

According to exemplary embodiments of the present inventive concept, the first semiconductor chip may be a logic chip disposed on the lower wiring substrate in a flip-chip or wire-bonding manner. The second semiconductor chip may be a memory chip disposed on the upper wiring substrate in a flip-chip or wire-bonding manner.

BRIEF DESCRIPTION OF THE DRAWINGS

The above and other features of the inventive concept will become more apparent by describing in detail exemplary embodiments thereof, with reference to the accompanying drawings, in which:

FIG. 2 is a cross-sectional view taken along line I-I' of FIG. 1 illustrating a semiconductor package according to exemplary embodiments of the present inventive concept;

DETAILED DESCRIPTION

Figure 1:
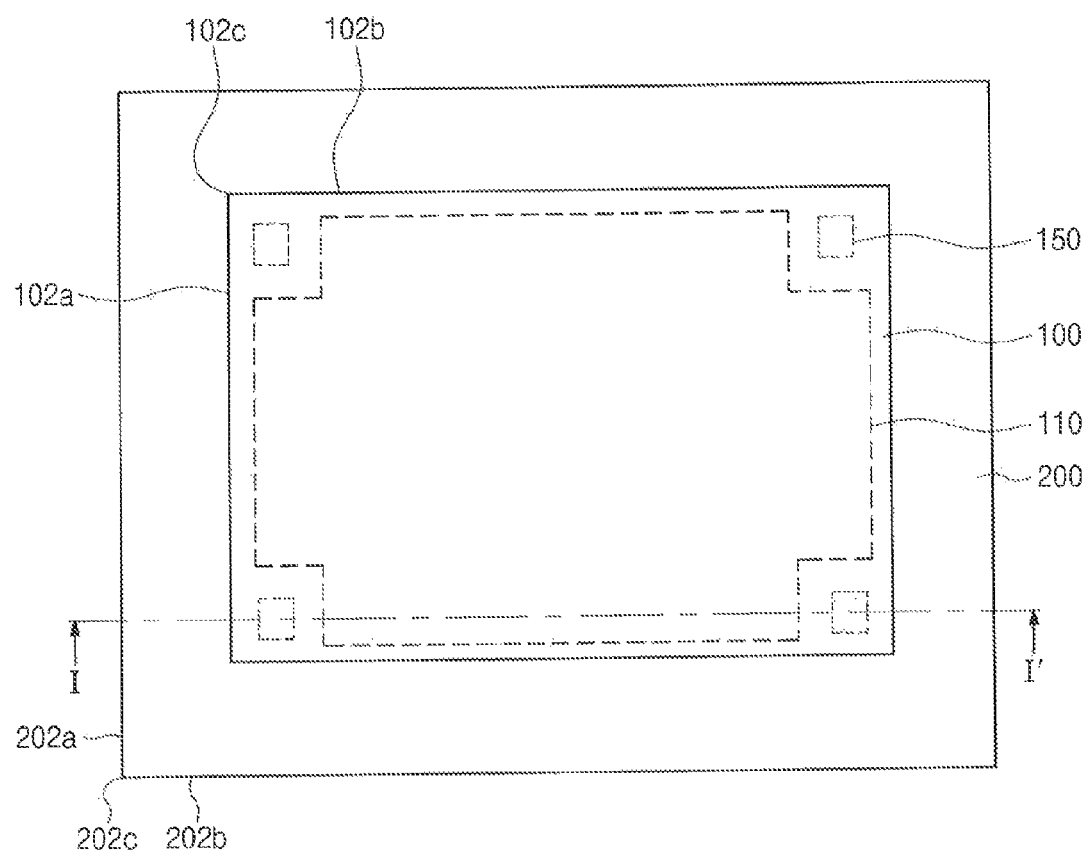
FIG. 1 is a schematic plan view illustrating a semiconductor package according to exemplary embodiments of the present inventive concept.

Exemplary embodiments of the present inventive concept will now be described more fully with reference to the accompanying drawings, in which some exemplary embodiments are shown. Exemplary embodiments of the present inventive concept may, however, be embodied in many different forms and should not be construed as being limited to the embodiments set forth herein. In the drawings, the thicknesses of layers and/or regions may be exaggerated for clarity. The relative thicknesses and positioning of molecules, layers, regions and/or structural elements may be reduced or exaggerated for clarity. Like reference numerals may refer to like elements throughout the specification and drawings.

It will be understood that when an element is referred to as being "connected" or "coupled" to another element, it can be directly connected or coupled to the other element or intervening elements may be present. FIG. 1 is a schematic plan view illustrating a semiconductor package according to exemplary embodiments of the present inventive concept. FIG. 2 is a sectional view taken along line I-I' of FIG. 1 illustrating a semiconductor package according to exemplary embodiments of the present inventive concept.

Referring to FIGS. 1 and 2, a semiconductor package may include a semiconductor chip 100, a wiring substrate 200, mounting connection terminals 120, connection members 150, and a molding part 190.

The semiconductor chip 100 may include an active surface 101 and a non-active surface 103 facing the active surface 101. The active surface 101 may include a bonding pad region 110, on which bonding pads 114 may be disposed. On the bonding pad region 110, the bonding pads 114 may be disposed in a desired bonding pad arrangement. The semiconductor chip 100 may include sides 102a and 102b including an edge thereof and corners 102c. Each of the corners 102c may be defined by adjacent sides 102a and 102b.

The wiring substrate 200 may include a variety of substrates, for example, a printed circuit board (PCB), a flexible substrate, or a tape substrate. According to exemplary embodiments of the present inventive concept, the wiring substrate 200 may include a flexible PCB, a rigid PCB, or any combination thereof and may include internal wires (not shown) disposed therein. The wiring substrate 200 may include a top surface 201 and a bottom surface 203. Upper connection pads 212 may be disposed on the top surface 201 of the wiring substrate 200, and lower connection pads 214 may be disposed on the bottom surface 203 of the wiring substrate 200. Outer connection terminals 220 may be disposed on the lower connection pads 214, respectively, of the wiring substrate 200 and may provide electric pathways to an external circuit. Outer connection terminals 220 may include a conductive bump, a solder ball, a conductive spacer, a Pin Grid Array (PGA), or any combination thereof. According to exemplary embodiments of the present inventive concept, the outer connection terminals 220 may be solder balls. The wiring substrate 200 may include sides 202a and 202b including an edge thereof and corners 202c. Each of the corners 202c may be defined by adjacent sides 202a and 202b.

According to exemplary embodiments of the present inventive concept, the semiconductor chip 100 may be disposed, in a flip-chip manner, on the top surface 201 of the wiring substrate 200. The bonding pads 114 of the semiconductor chip 100 may be electrically connected to the upper connection pads 212 of the wiring substrate 200 via the mounting connection terminals 120. For example, the mounting connection terminals 120 may be solder balls or solder bumps. The mounting connection terminals 120 may be copper pillars or micro balls.

The connection members 150 may be disposed between the semiconductor chip 100 and the wiring substrate 200. When viewed in plan view, the connection members 150 may be disposed adjacent to the corners 102c, respectively. The connection members 150 may be spaced apart from the bonding pad region 110. The connection members 150 may include first contact members 135 disposed on the active surface 101 of the semiconductor chip 100 and second contact members 145 disposed on the top surface 201 of the wiring substrate 200. The first contact members 135 may be disposed in the second contact members 145, respectively, and may be in physical contact with the second contact members 145. Although not shown, in exemplary embodiments of the present inventive concept, the first contact member 135 and the second contact member 145 may be disposed on the non-active surface 103 of the semiconductor chip 100, and when viewed in plan view, may be in line with the first contact members 135.

The first contact members 135 may be disposed on the active surface 101 of the semiconductor chip 100 and may be adjacent to the corners 102c between the adjacent sides 102a and 102b. Each of the first contact members 135 may include a structure protruding from the active surface 101 of the semiconductor chip 100. For example, each of the first contact members 135 may have a hexahedral, cylindrical, or polyhedral shape. The second contact members 145 may be disposed on the top surface 201 of the wiring substrate 200 and may face the first contact members 135. For example, the second contact members 145, when viewed in plan view, may be in line with the first contact members 135. The second contact members 145 may include a structure protruding from the top surface 201 of the wiring substrate 200. For example, each of the second contact members 145 may have a hexahedral, cylindrical, or polyhedral shape.

The connection members 150 may include a magnetic material. For example, the connection members 150 may include a ferromagnetic material. The ferromagnetic material may include iron Fe, nickel Ni, cobalt Co, or any alloys thereof or of permanent magnetic materials containing $Nd_2Fe_{14}B$, $SmCo_5$, $Sm_2Co_{17}$, $BaFe_{12}O_{19}$, or AlNiCo.

According to exemplary embodiments of the present inventive concept, magnetic materials included in the first contact members 135 and the second contact members 145 may have an attractive force for each other. For example, a pair of the first and second contact members 135 and 145 may have magnetic polar orientations that are opposite to each other. The magnetic materials for the first and second contact members 135 and 145 may be variously selected to counteract a warpage, which may occur in the semiconductor package. For example, in the case where warpage of the semiconductor package is relatively small, the first and second contact members 135 and 145 may be configured to include one or more ferromagnetic materials. By contrast, in the case where warpage of the semiconductor package is relatively large, the first and second contact members 135 and 145 may be configured to include one or more permanent magnetic materials. According to exemplary embodiments of the present inventive concept, one of the first and second contact members 135 or 145 may include one or more ferromagnetic material containing iron Fe, nickel Ni, and/or cobalt Co, while the other may include one or more permanent magnetic material containing $Nd_2Fe_{14}B$, $SmCo_5$, $Sm_2Co_{17}$, $BaFe_{12}O_{19}$, and/or AlNiCo.

The first and/or second contact members 135 and 145 may be formed by a chemical vapor deposition, a physical vapor deposition, an electroplating process, an electroless plating process, or a stencil printing process. According to exemplary embodiments of the present inventive concept, the first and second contact members 135 and 145 may be independently formed by different processes and may be attached to the semiconductor chip 100 or the wiring substrate 200 by an adhesive layer.

The molding part 190 may cover the top surface 201 of the wiring substrate 200 and side surfaces of the semiconductor chip 100 and may fill a gap region between the semiconductor chip 100 and the wiring substrate 200. The molding part 190 may include a molded underfill (MUF) pattern, which may expose the non-active surface 103 of the semiconductor chip 100, which may be disposed on the wiring substrate 200. The molding part 190 may include an epoxy molding compound. The non-active surface 103 of the semiconductor chip 100 may be exposed, and may reduce a thickness of the semiconductor package. The molding part 190 may be coplanar with a side surface of the wiring substrate 200, but exemplary embodiments of the present inventive concept are not limited thereto. For example, the molding part 190 may have a slanted sidewall at an angle to the top surface 201 of the wiring substrate 200. Although not shown, in exemplary embodiments of the present inventive concept, the molding part 190 may cover the top surface 201 of the wiring substrate 200 and the semiconductor chip 100 and may fill the gap region between the semiconductor chip 100 and the wiring substrate 200. For example, the molding part 190 may include a molded underfill (MUF) pattern, which may cover the non-active surface 103 of the semiconductor chip 100 disposed on the wiring substrate 200.

Figure 3A:
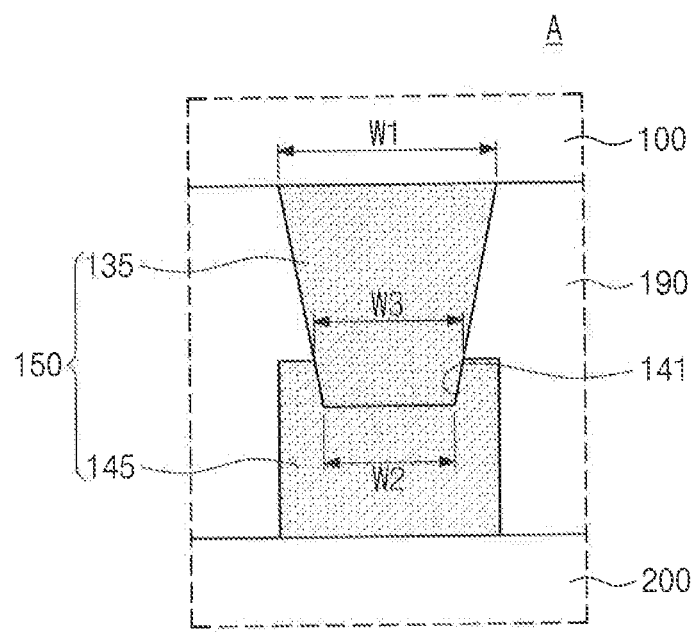
FIG. 3A is an enlarged cross-sectional view of a portion A of FIG. 2 illustrating connection members according to exemplary embodiments of the present inventive concept.
Figure 3B:
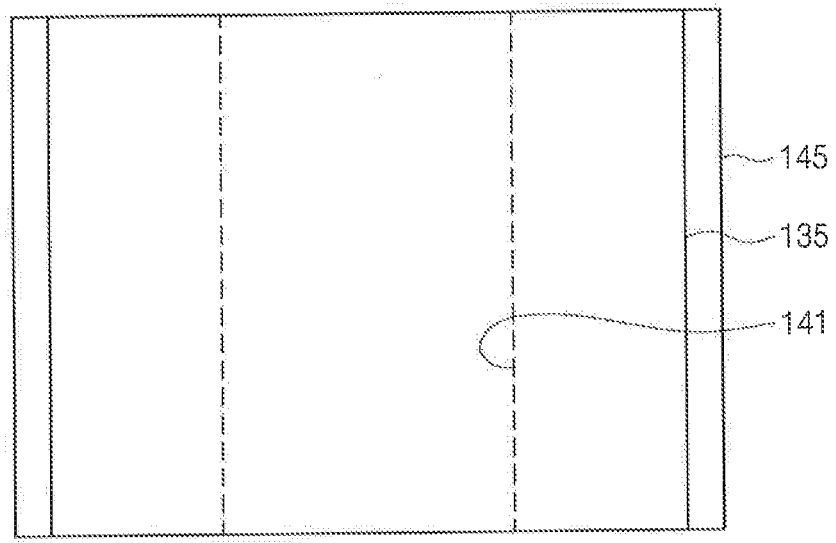
FIGS. 3B and 3C are plan views illustrating connection members according to exemplary embodiments of the present inventive concept.
Figure 3C:
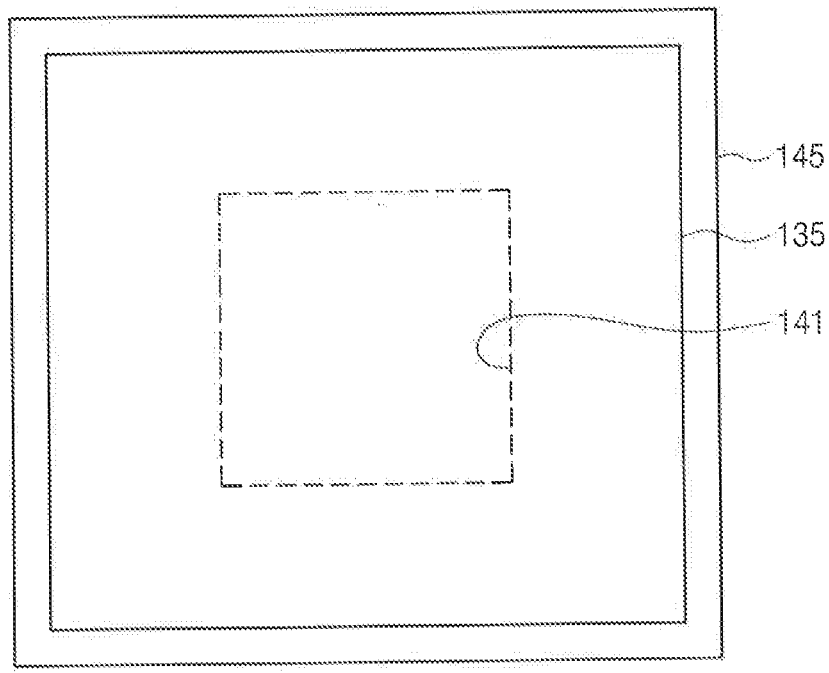
Figure 4:
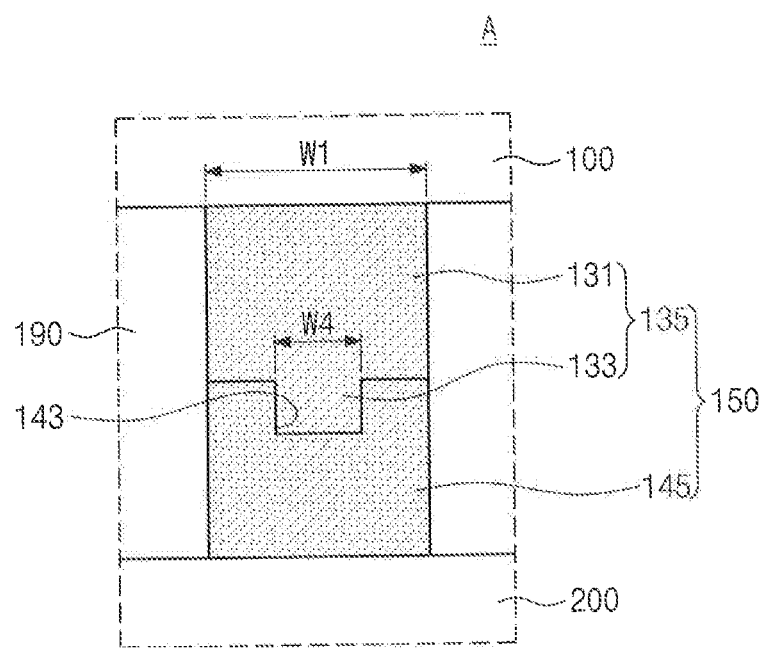
FIG. 4 is an enlarged sectional view of portion A of FIG. 2 illustrating connection members according to exemplary embodiments of the present inventive concept.

FIG. 3A is an enlarged sectional view of a portion A of FIG. 2 and illustrates connection members according to exemplary embodiments of the present inventive concept, and FIGS. 3B and 3C are plan views illustrating connection members according to exemplary embodiments of the present inventive concept. FIG. 4 is an enlarged sectional view of the portion A of FIG. 2 and illustrates connection members according to exemplary embodiments of the present inventive concept.

Referring to FIG. 3A, the first contact member 135 may include upper and lower portions in contact with the semiconductor chip 100 and the second contact member 145, respectively. In exemplary embodiments of the present inventive concept, the upper portion of the first contact member 135 may have an upper width W1, and the lower portion of the first contact member 135 may have a lower width W2 smaller than the upper width W1. For example, the first contact member 135 may have an inverted trapezoidal section having the lower width W2 smaller than the upper width W1. The second contact member 145 may have a recess 141, in which the first contact member 135 may be disposed. The recess 141 may be a slanted recess. For example, an upper width W3 of the recess 141 may be larger than the lower width W2 of the first contact member 135. The lower portion of the first contact member 135 may be disposed in the recess 141 of the second contact member 145 and may be in direct contact with the second contact member 145. A bottom surface of the lower portion of the first contact member 135 may be positioned at a level that is lower than an uppermost surface of the second contact member 145 and is higher than a bottom surface of the second contact member 145. In exemplary embodiments of the present inventive concept, as shown in FIG. 3B, the recess 141 may be between sidewalk of the second contact member 145 in contact with the first contact member 135. For example, the recess 141 may have a line or a bar shape, when viewed in plan view. In exemplary embodiments of the present inventive concept, as shown in FIG. 3C, the recess 141 may be between sidewalk of the second contact member 145 in contact with the first contact member 135.

Although not shown, in exemplary embodiments of the present inventive concept, the connection member 150 may be configured in such a way that the second contact member 145 is disposed in the first contact member 135. For example, the second contact member 145 may have an upper width that is smaller than a lower width, and the first contact member 135 may have a recess, in which an upper portion of the second contact member 145 may be disposed.

Referring to FIG. 4, the first contact member 135 may include a central portion 131 and a protruding portion 133 extending from the central portion 131. The protruding portion 133 may have a width W4 that is smaller than a width W1 of the central portion 131. The second contact member 145 may have a recess 143, in which the protruding portion 133 of the first contact member 135 may be disposed. The protruding portion 133 of the first contact member 135 may be disposed in the recess 143 of the second contact member 145 and may be in direct contact with the second contact member 145. A bottom surface of the protruding portion 133 disposed in the recess 143 may be disposed at a level that is lower than the uppermost surface of the second contact member 145 and is higher than the bottom surface of the second contact member 145. In exemplary embodiments of the present inventive concept, the connection member 150 may be configured in such a way that the second contact member 145 is disposed in the first contact member 135. For example, the second contact member 145 may include a protruding portion, and the first contact member 135 may have a recess, in which the second contact member 145 may be disposed. Although not shown, the connection member 150 of FIG. 4 may have the same planar structure as that of FIG. 3B or FIG. 3C.

According to exemplary embodiments of the present inventive concept, the connection member 150 may include a pair of contact members, one of which is disposed in the other. Exemplary embodiments of the present inventive concept are not limited to the exemplary embodiments described with reference to FIGS. 3A through 4.

According to exemplary embodiments of the present inventive concept, in a fabrication of the semiconductor package, the connection members including a magnetic material may be used to mount the semiconductor chip on the wiring board. Warping or bending of the semiconductor package after a soldering process for forming the connection terminals may be reduced. The connection members may be in contact with each other, one may be inserted into the other, and thus, the semiconductor package may have increased structural stability. Reduction of warpage of the semiconductor package may increase reliability, package yield, and usability of the semiconductor package.

Figure 5:
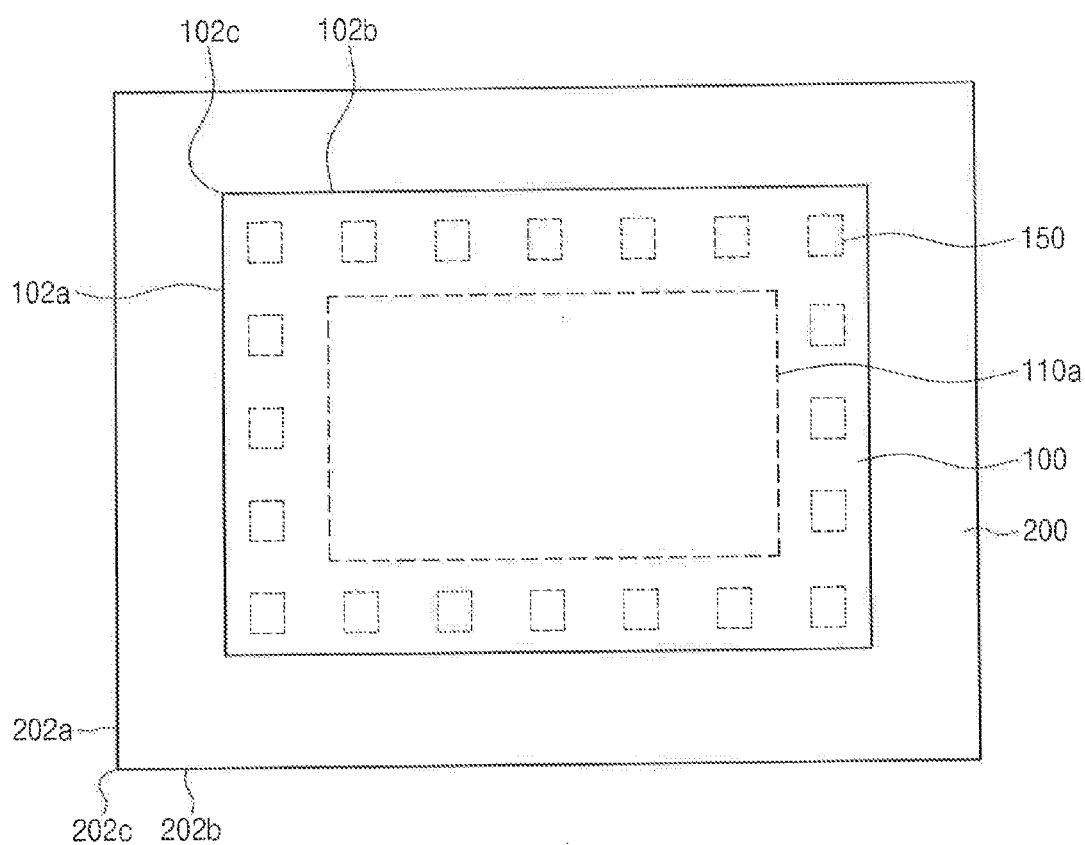
FIG. 5 is a schematic plan view illustrating a semiconductor package according to exemplary embodiments of the present inventive concept.

FIG. 5 is a schematic plan view illustrating a semiconductor package according to exemplary embodiments of the present inventive concept. Those elements and features in FIG. 5 that are the same or similar to those shown and described in the earlier figures might not be described again. Except for the connection members 150, the semiconductor package of FIG. 5 may have the same configuration as that of the semiconductor package of FIG. 1.

Referring to FIGS. 2 and 5, the semiconductor chip 100 may include the active surface 101 and the non-active surface 103 facing the active surface 101, and the active surface 101 may include a bonding pad region 110a, on which the bonding pads 114 may be disposed. The bonding pads 114 may be disposed on the bonding pad region 110a and may have a desired bonding pad arrangement. The semiconductor chip 100 may include the sides 102a and 102b including the edge thereof and the corners 102c. Each of the corners 102c may be defined by adjacent sides 102a and 102b. When viewed in plan view, one or more of the connection members 150 may be disposed adjacent to the corners 102c, respectively and the other of the connection members 150 may be disposed along the sides 102a and 102b.

Figure 6:
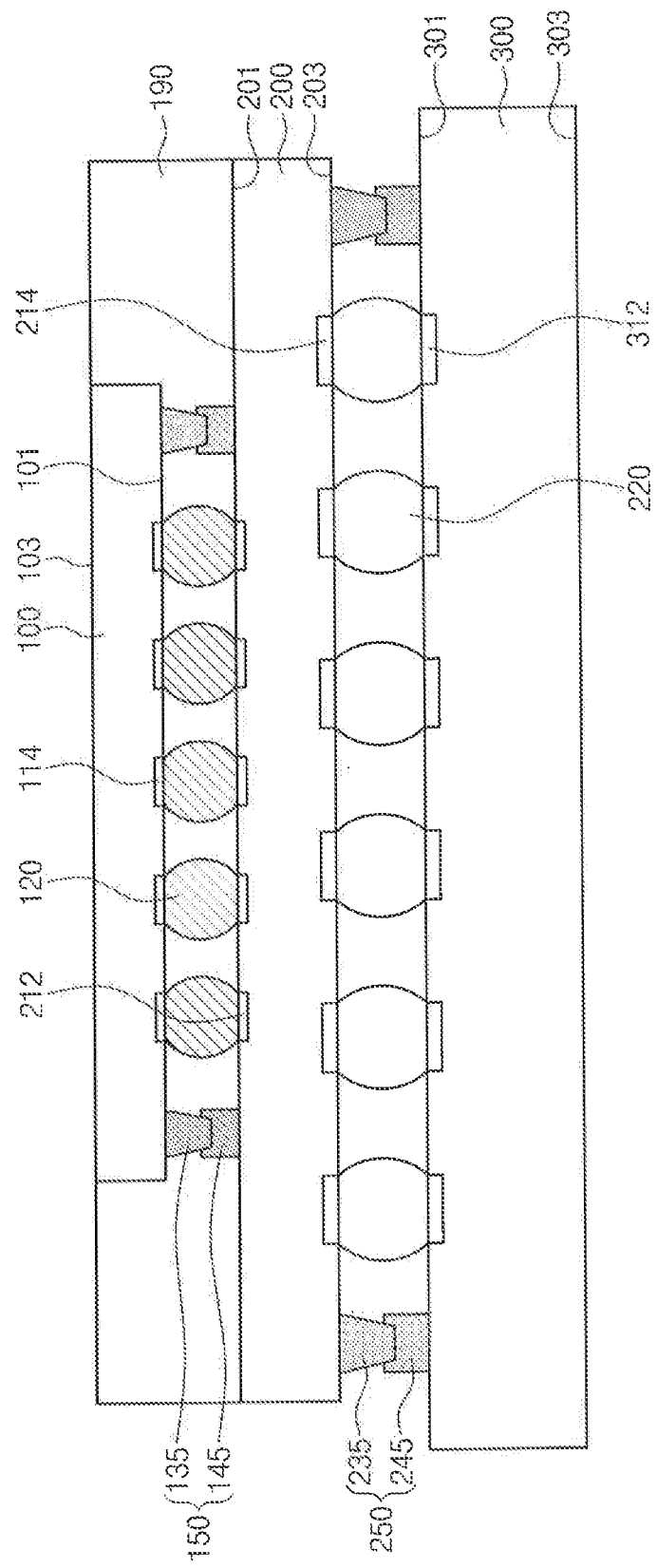
FIG. 6 is a sectional view illustrating a semiconductor package according to exemplary embodiments of the present inventive concept.

FIG. 6 is a sectional view illustrating a semiconductor package according to exemplary embodiments of the present inventive concept. Elements and features in FIG. 6 that are the same or similar to those shown and described in earlier figures might not be described in more detail with reference to FIG. 6.

Referring to FIGS. 1, 2, and 6, the semiconductor package of FIGS. 1 and 2 may be disposed on a main board 300. The main board 300 may include a top surface 301, on which outer connection pads 312 may be disposed, and a bottom surface 303 facing the top surface 301. The outer connection pads 312 of the main board 300 may be electrically connected to the lower connection pads 214 of the wiring substrate 200 via the outer connection terminals 220. The main board 300 may be a mother board including several internal circuits and/or several devices (not shown).

In exemplary embodiments of the present inventive concept, the first connection members 150 may be disposed between the semiconductor chip 100 and the wiring substrate 200, and second connection members 250 may be disposed between the wiring substrate 200 and the main board 300. When viewed in plan view, the second connection members 250 may be disposed adjacent to the corners 202c, respectively, of the wiring substrate 200. In exemplary embodiments of the present inventive concept, when viewed in plan view, some of the second connection members 250 may be disposed adjacent to the corners 202c, respectively, of the wiring substrate 200, and the others of the second connection members 250 may be disposed along the sides 202a and 202b of the wiring substrate 200. Each of the second connection members 250 may include a first contact member 235 disposed on the bottom surface 203 of the wiring substrate 200 and a second contact member 245 disposed on the top surface 301 of the main board 300.

The first contact members 235 of the second connection members 250 may be disposed on the bottom surface 203 of the wiring substrate 200 and may be adjacent to the corners 202c between adjacent sides 202a and 202b. In exemplary embodiments of the present inventive concept, on the bottom surface 203 of the wiring substrate 200, the first contact members 235 of the second connection members 250 may be disposed along the sides 202a and 202b of the wiring substrate 200.

The second contact members 245 of the second connection members 250 may be disposed on the top surface 301 of the main hoard 300 and may face the first contact members 235 of the second connection members 250. For example, when viewed in plan view, the second contact members 245 may overlap or may be in line with the first contact members 235, respectively. The first and second contact members 235 and 245 of the second connection members 250 may have the same shape as that of the first and second contact members 135 and 145 of the first connection members 150, and the first and second contact members 135 and 145 of the first connection members 150 may be configured in such a way that one is disposed in the other. The first and second contact members 235 and 245 of the second connection members 250 may include a same material and may be formed by a same method as those of the first and second contact members 135 and 145 of the first connection members 150.

Figure 7:
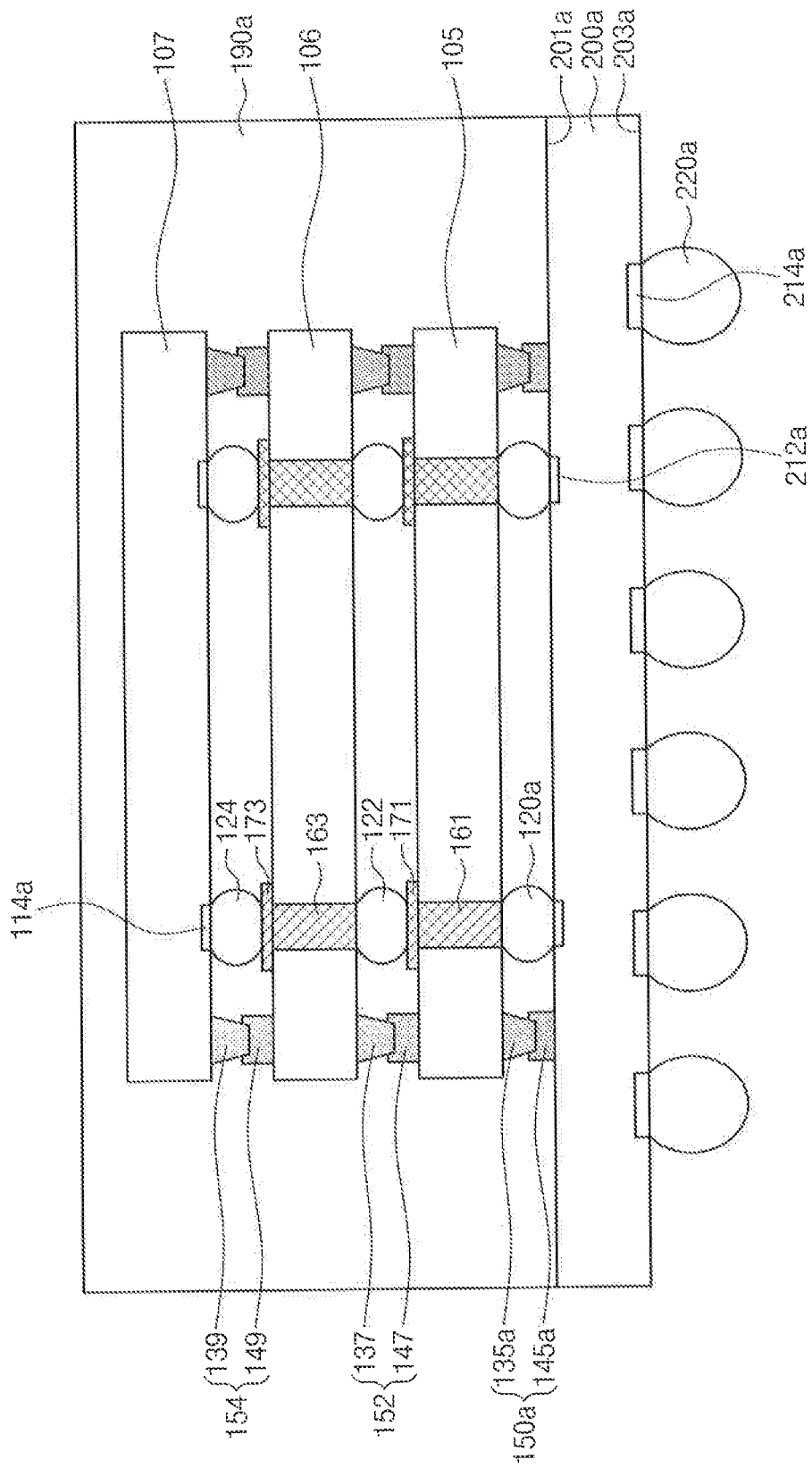
FIG. 7 is a cross-sectional view illustrating a multi-chip semiconductor package according to exemplary embodiments of the present inventive concept.

FIG. 7 is a cross-sectional view illustrating a multi-chip semiconductor package according to exemplary embodiments of the present inventive concept. Elements and features in FIG. 7 that are the same or similar to those shown or described in earlier figures might not be described again.

Referring to FIG. 7, a multi-chip semiconductor package may include a wiring substrate 200a and first, second, and third semiconductor chips 105, 106, and 107 sequentially stacked on the wiring substrate 200a.

Each of the first and second semiconductor chips 105 and 106 may include a first through electrode 161 and a second through electrode 163. Although not shown, the third semiconductor chip 107 may include a through electrode, and a plurality of semiconductor chips may be stacked on the third semiconductor chip 107. Each of the first to third semiconductor chips 105 to 107 may have substantially the same elements as those of the semiconductor chip 100 of FIGS. 1 and 2, except for the presence of the through electrodes 161 and 163. The semiconductor chips 105 to 107 may be electrically connected to each other via the through electrodes 161 and 163, interconnection layers 171 and 173, mounting connection terminals 122 and 124, and/or bonding pads 114a. The lowermost semiconductor chip (e.g., the first semiconductor chip 105) of the semiconductor chips 105 to 107 may be electrically connected to an upper connection pad 212a of the wiring substrate 200a via a mounting connection terminal 120a.

The first connection members 150a may be disposed between the wiring substrate 200a and the first semiconductor chip 105. Second connection members 152 may be disposed between the first semiconductor chip 105 and the second semiconductor chip 106, and third connection members 154 may be disposed between the second semiconductor chip 106 and the third semiconductor chip 107. Although not shown, a plurality of semiconductor chips may be stacked on the third semiconductor chip 107, and connection members may be disposed between the additional semiconductor chips. When viewed in plan view, the first, second and third connection members 150a, 152, and 154 may be disposed adjacent to corners of the semiconductor chips (e.g., semiconductor chip 100), as shown in FIG. 1 or along side surfaces of the semiconductor chip 105, 106 or 107, as shown in FIG. 5.

Each of the first, second and third connection members 150a, 152, and 154 may include a corresponding one of the first contact members 135a, 137, and 139 and a corresponding one of the second contact members 145a, 147, and 149. The first and second contact members 135a and 145a of the first connection members 150a may have substantially the same shapes as those of the first and second contact members 135 and 145, respectively, of FIGS. 1 through 4. For example, similar to the first and second contact members 135 and 145 of FIGS. 1 through 4, the first and second contact members 135a and 145a of the first connection members 150a may be configured in such a way that one is disposed in the other. The first to second contact members 135a and 145a of the first connection members 150a may include a same material and may be formed by a same method as those of the first and second contact members 135 and 145 of FIGS. 1 through 4. The first and second contact members 137 and 147 of the second connection members 152 may have substantially the same shapes as those of the first and second contact members 135 and 145, respectively, of FIGS. 1 through 4. For example, similar to the first and second contact members 135 and 145 of FIGS. 1 through 4, the first and second contact members 137 and 147 of the second connection members 152 may be configured in such a way that one is disposed in the other. The first and second contact members 137 and 147 of the second connection members 152 may include a same material and may be termed by a same method as those of the first and second contact members 135 and 145 of FIGS. 1 through 4. The first and second contact members 139 and 149 of the third connection members 154 may have substantially the same shapes as those of the first and second contact members 135 and 145, respectively, of FIGS. 1 through 4. For example, similar to the first and second contact members 135 and 145 of FIGS. 1 through 4, the first and second contact members 139 and 149 of the third connection members 154 may be configured in such a way that one is disposed in the other. The first and second contact members 139 and 149 of the third connection members 154 may include a same material and may be formed by a same method as those of the first and second contact members 135 and 145 of FIGS. 1 through 4.

Outer connection terminals 220a may be disposed on lower connection pads 214a, respectively, of the wiring substrate 200a and may provide electric pathways to an external circuit. A molding part 190a may cover a top surface 201a of the wiring substrate 200a and side surfaces of the semiconductor chips 105, 106, and 107 and may fill a gap region between the wiring substrate 200a and the first semiconductor chip 105 and gap regions between the semiconductor chips 105, 106, and 107. The molding part 190a may include a same material and may be formed by a same method as those of the molding part 190 of FIG. 2.

Figure 8:
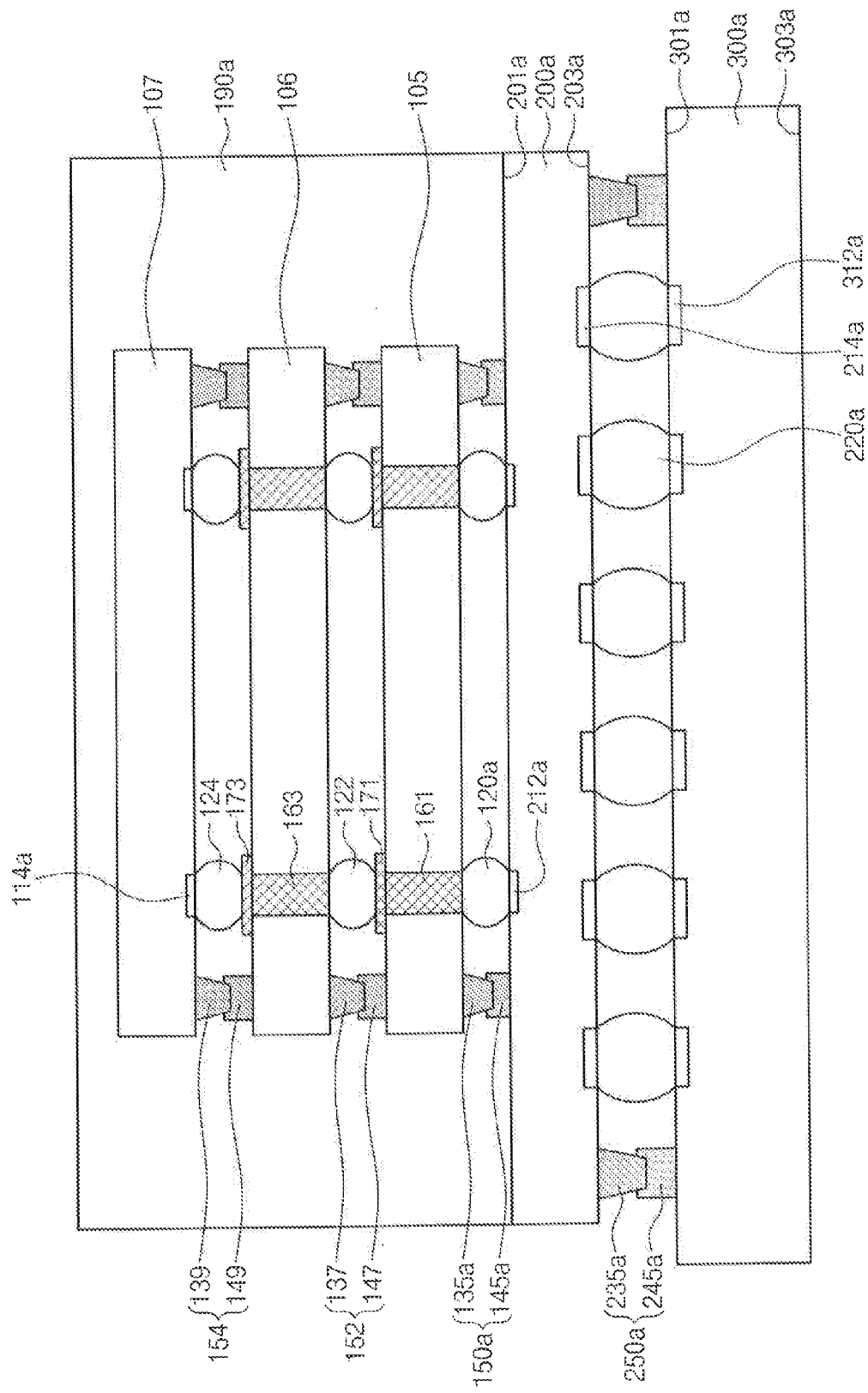
FIG. 8 is a cross-sectional view illustrating a multi-chip semiconductor package according to exemplary embodiments of the present inventive concept.

FIG. 8 is a cross-sectional view illustrating a multi-chip semiconductor package according to exemplary embodiments of the present inventive concept. Those elements and features not described below with respect to FIG. 8 may be assumed to be substantially the same as those corresponding to features previously described with respect to FIG. 7.

Referring to FIG. 8, the multi-chip semiconductor package of FIG. 7 may be disposed on a main board 300a. The main board 300a may have a top surface 301a, on which outer connection pads 312a are disposed, and a bottom surface 303a facing the top surface 301a. The outer connection pads 312a of the main board 300a may be electrically connected to the lower connection pads 214a of the wiring substrate 200a via the outer connection terminals 220a. The main board 300a may be a mother board including several circuits and/or devices (not shown).

In exemplary embodiments of the present inventive concept, fourth connection members 250a may be disposed between the main board 300a and the wiring substrate 200a. When viewed in plan view, the fourth connection members 250a may be disposed adjacent to the corners, respectively, of the wiring substrate 200a. In exemplary embodiments of the present inventive concept, when viewed in plan view, the fourth connection members 250a may be disposed along the sides of the wiring substrate 200a. The fourth connection members 250a may include first contact members 235a disposed on a bottom surface 203a of the wiring substrate 200a and second contact members 245a disposed on the top surface 301a of the main board 300a.

The first contact members 235a of the fourth connection members 250a may be disposed on the bottom surface 203a of the wiring substrate 200a and may be adjacent to the corners, respectively, of the wiring substrate 200a. In exemplary embodiments of the present inventive concept, the first contact members 235a of the fourth connection members 250a may be disposed along the sides of the wiring substrate 200a.

The second contact members 245a of the fourth connection members 250a may be disposed on the top surface 301a of the main board 300a and may face the first contact members 235a of the fourth connection members 250a, respectively. For example, when viewed in plan view, the second contact members 245a may be overlap or be in line with the first contact members 235, respectively. The first and second contact members 235a and 245a of the fourth connection members 250a may have the same shape as that of the first and second contact members 135a and 145a, respectively, of the first connection members 150a. For example, similar to the first and second contact members 135a and 145a of the first connection members 150a, the first and second contact members 235a and 245a of the fourth connection members 250a may be configured in such a way that one is disposed in the other. The first and second contact members 235a and 245a of the fourth connection members 250a may include a same material and may be formed by a same method as those of the first and second contact members 135a and 145a of the first connection members 150a.

Figure 9:
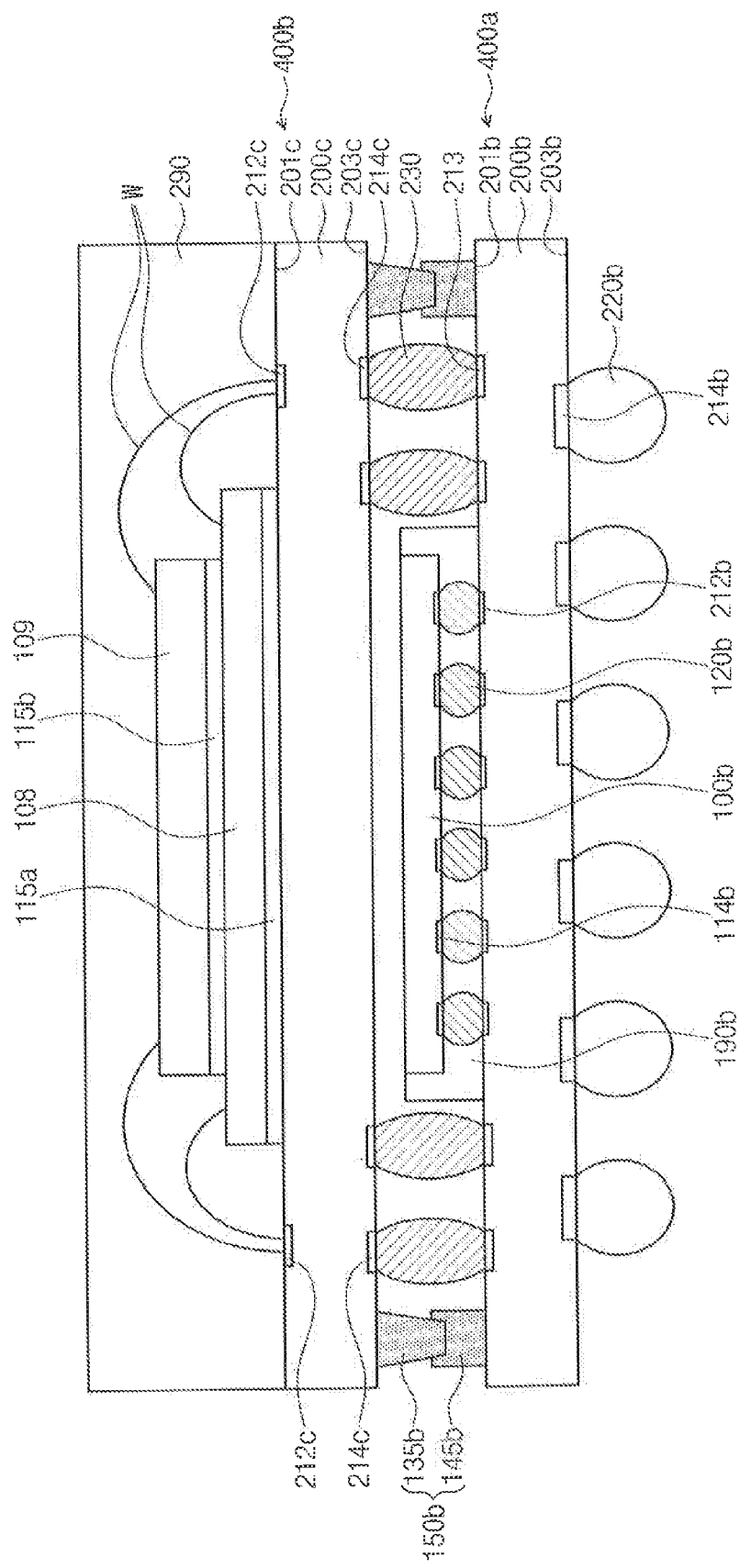
FIG. 9 is a cross-sectional view illustrating a stack-type semiconductor package according to exemplary embodiments of the present inventive concept.

FIG. 9 is a cross-sectional view illustrating a stack-type semiconductor package according to exemplary embodiments of the present inventive concept. Those elements and features described below with respect to FIG. 9 may be assumed to be substantially the same as those corresponding to features previously described with respect to FIG. 7.

Referring to FIG. 9, the stack-type semiconductor package may include a lower package 400a, an upper package 400b, stacking connection terminals 230, and connection members 150b.

The lower package 400a may include a lower wiring substrate 200b and one or more lower semiconductor chips 100b disposed on the lower wiring substrate 200b. The upper package 400b may include an upper wiring substrate 200c and one or more upper semiconductor chips 108 and/or 109 disposed on the upper wiring substrate 200c.

In the stack-type semiconductor package, the upper package 400b may be stacked on the lower package 400a. For example, the stack-type semiconductor package may have a package-on-package (PoP) structure. The lower and upper packages 400a and 400b may have the same area, when viewed in plan view. The lower and upper packages 400a and 400b may have different areas from each other, when viewed in plan view. The upper package 400b may be electrically connected to the lower package 400a via the stacking connection terminals 230. For example, the upper wiring substrate 200c may include lower connection pads 214c connected to the stacking connection terminals 230, and the lower wiring substrate 200b may include upper connection pads 213 connected to the stacking connection terminals 230. In exemplary embodiments of the present inventive concept, the stacking connection terminals 230 may be solder balls.

The lower semiconductor chip 100b and the upper semiconductor chips 108 or 109 may be disposed in a flip-chip and/or wire bonding manner on the lower and upper wiring substrates 200b and 200c, respectively, and may be electrically connected to the lower and upper wiring substrates 200b and 200c, respectively. For example, the lower semiconductor chip 100b may include bonding pads 114b and the lower wiring substrate 200b may include upper connection pads 212b, and the bonding pads 114b may be electrically connected to the upper connection pads 212b via mounting connection terminals 120b. In exemplary embodiments of the present inventive concept, the upper semiconductor chips 108 and 109 may be disposed on the upper wiring substrate 200c in a wire-bonding manner. For example, the upper semiconductor chips 108 and 109 may be disposed on the upper wiring substrate 200c by adhesive layers 115a and 115b and may be electrically connected to upper connection pads 212c of the upper wiring substrate 200c by bonding wires W, but exemplary embodiments of the present inventive concept are not be limited thereto. One or more of the lower semiconductor chip 100b and the upper semiconductor chips 108 and 109 may be a volatile memory device (e.g., a dynamic random access memory (DRAM), a static ram (SRAM), and so forth), a nonvolatile memory device (e.g., FLASH), a photoelectronic device, a logic device, a communication device, a digital signal processor (DSP), or a system-on-chip (SOC).

In exemplary embodiments of the present inventive concept, the connection members 150b may be disposed between the lower package 400a and the upper package 400b. When viewed in plan view, the connection members 150b may be disposed adjacent to the corners, respectively, of the lower or upper wiring substrate 200b or 200c. The connection members 150b may be disposed along the sides of the lower or upper wiring substrate 200b or 280c. The connection members 150b may include first contact members 135b disposed on a bottom surface 203c of the upper wiring substrate 200c and second contact members 145b disposed on a top surface 201b of the lower wiring substrate 200b.

The first and second contact members 135b and 145b may have substantially the same shapes as those of the first and second contact members 135 and 145, respectively, of FIGS. 1 through 4. For example, similar to the first and second contact members 135 and 145 of FIGS. 1 through 4, the first and second contact members 135b and 145b may be configured in such a way that one is disposed in the other. The first to second contact members 135b and 145b may include a same material and may be formed by a same method as those of the first and second contact members 135 and 145 of FIGS. 1 through 4.

The stacking semiconductor package may include one or more outer connection terminal 220b disposed on a bottom surface 203b of the lower wiring substrate 200b. The outer connection terminal 220b may allow the semiconductor package to be disposed on the main board 300a and may electrically connect the semiconductor package to the main board 300a. A lower molding part 190b may be disposed on the lower wiring substrate 200b and may cover the lower semiconductor chip 100b. An upper molding part 290 may cover the upper semiconductor chips 108 and/or 109 and the upper wiring substrate 200c. The lower and/or upper molding parts 190b and 290 may include an epoxy molding compound.

Figure 10:
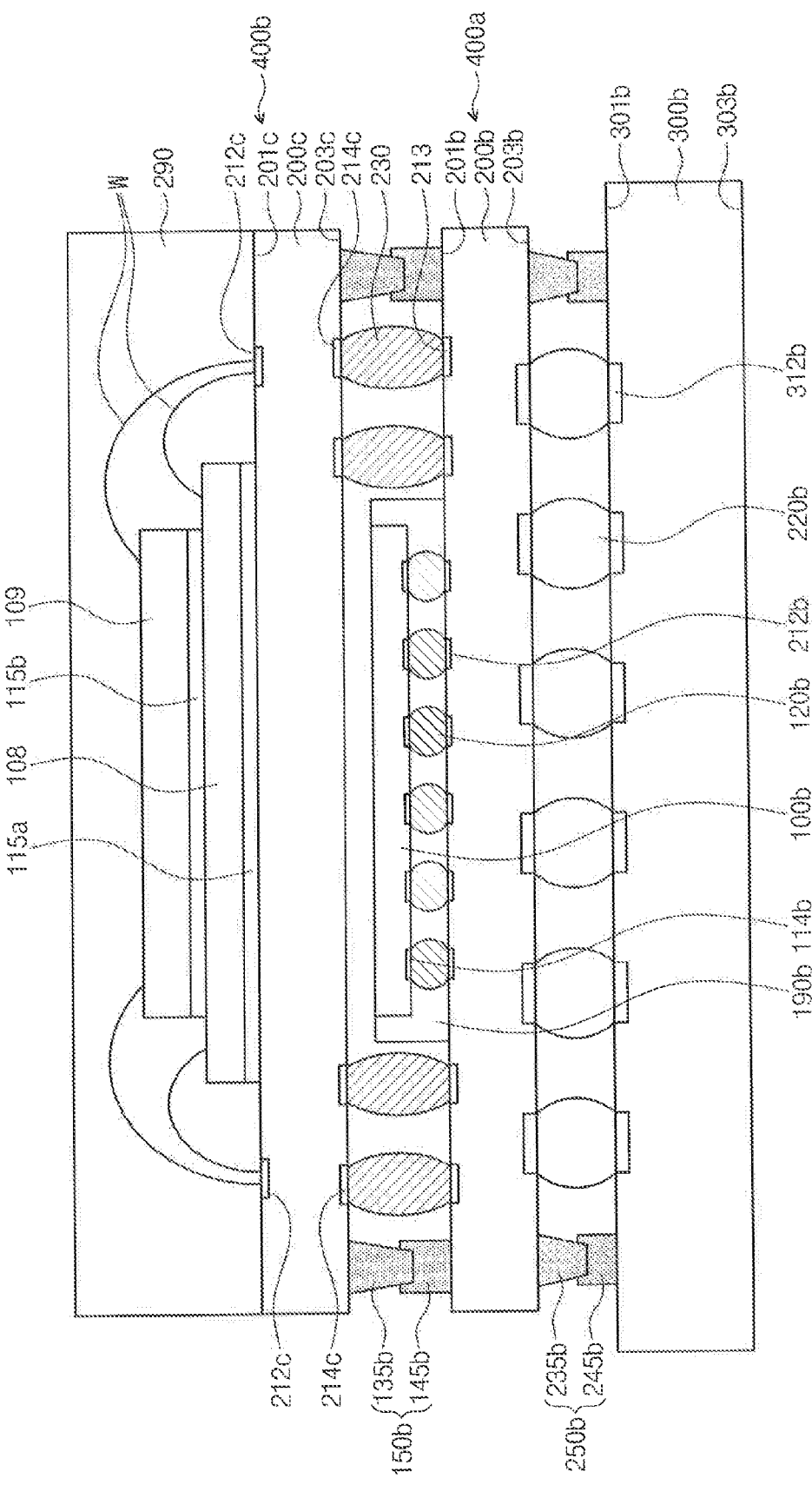
FIG. 10 is a cross-sectional view illustrating a stack-type semiconductor package according to exemplary embodiments of the present inventive concept.

FIG. 10 is a cross-sectional view illustrating a stack-type semiconductor package according to exemplary embodiments of the present inventive concept. Those elements and features not described below with respect to FIG. 10 may be assumed to be substantially the same as those corresponding to features previously described with respect to FIG. 7. Referring to FIG. 10, the stack-type semiconductor package of FIG. 9 may be disposed on a main board 300b. The main board 300b may have a top surface 301b, on which outer connection pads 312b are disposed, and a bottom surface 303b facing the top surface 301b. The outer connection pads 312b of the main board 300b may be electrically connected to lower connection pads 214b of the lower wiring substrate 200b via the outer connection terminals 220b. The main board 300b may be a mother board including several circuits and/or devices (not shown).

In exemplary embodiments of the present inventive concept, the first connection members 150b may be disposed between the lower wiring substrate 200b and the upper wiring substrate 200c, and second connection members 250b may be disposed between the lower wiring substrate 200b and the main board 300a. When viewed in plan view, the second connection members 250b may be disposed adjacent to the corners, respectively, of the lower wiring substrate 200b. In an exemplary embodiment of the present inventive concept, when viewed in plan view, the second connection members 250b may be disposed along the sides of the lower wiring substrate 200b. The second connection members 250b may include first contact members 235b disposed on the bottom surface 203b of the lower wiring substrate 200b and second contact members 245b disposed on the top surface 301b of the main board 300b.

The first contact members 235b of the second connection members 250b may be disposed on the bottom surface 203b of the lower wiring substrate 200b and may be adjacent to the corners, respectively, of the lower wiring substrate 200b. In an exemplary embodiment of the present inventive concept, on the bottom surface 203b of the lower wiring substrate 200b, the first contact members 235b of the second connection members 250b may be disposed along the sides of the lower wiring substrate 200b.

The second contact members 245b of the second connection members 250b may be disposed on the top surface 301b of the main board 300b and may face the first contact members 235b of the second connection members 250b, respectively. For example, when viewed in plan view, the second contact members 245b on the top surface 301b of the main board 300b may overlap and be in line with the first contact members 235b, respectively. The first and second contact members 235b and 245b of the second connection members 250b may have substantially the same shapes as those of the first and second contact members 135b and 145b of the first connection members 150b. For example, similar to the first and second contact members 135b and 145b of the first connection members 150b, the first and second contact members 235b and 245b may be configured in such a way that one is disposed in the other. The first and second contact members 235b and 245b of the second connection members 250b may include a same material and may be formed by a same method as those of the first and second contact members 135b and 145b of the first connection members 150b.

According to exemplary embodiments of the present inventive concept, connection members including a magnetic material may mount the semiconductor chip or the semiconductor package on the substrate or may stack one or more semiconductor packages on other semiconductor package. Warping and bending of semiconductor packages after a soldering process for forming the connection terminals may be reduced. The connection members may be in contact with each other, and one connection member may be disposed in the other, and thus, the semiconductor package may have increased structural stability. Reduced warpage of the semiconductor package may increase reliability, package yield, and usability of the semiconductor package.

Figure 11:
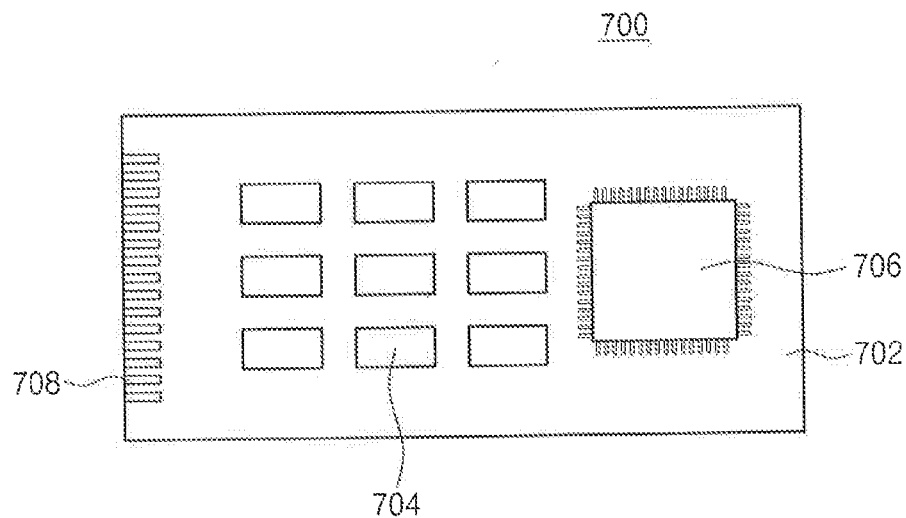
FIG. 11 is a plan view illustrating a package module according to exemplary embodiments of the present inventive concept.

FIG. 11 is a plan view illustrating a package module according to exemplary embodiments of the present inventive concept.

Referring to FIG. 11, a package module 700 may include a module substrate 702, which may include one or more external connection terminals 708. The package module 700 may include one or more semiconductor chips 704 and one or more semiconductor packages 706, for example, a quad-flat-package (QFP) structure, disposed on the module substrate 702. The semiconductor packages 706 may include one or more semiconductor packages according to exemplary embodiments of the present inventive concept. The package module 700 may be electrically connected to an external electronic device via the external connection terminal 708.

Figure 12:
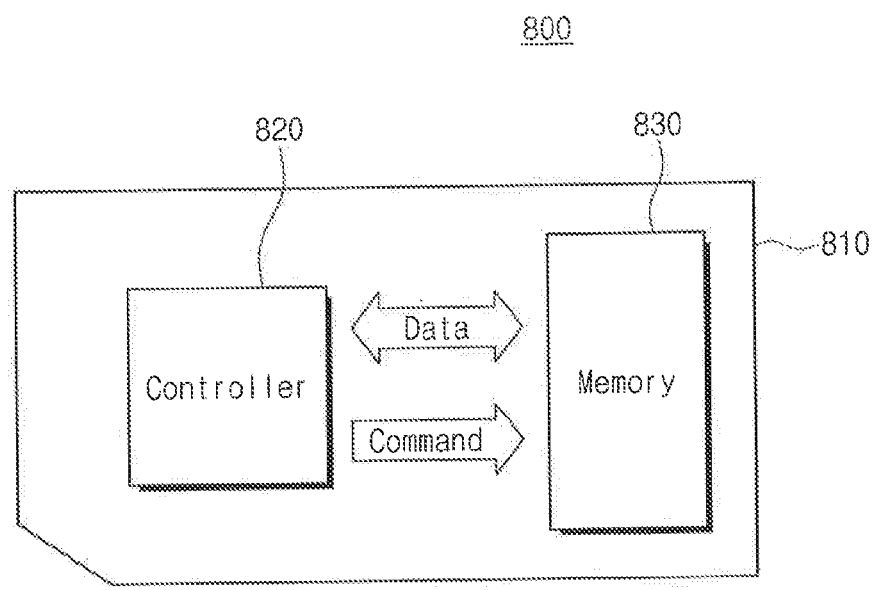
FIG. 12 is a block diagram illustrating a memory card according to exemplary embodiments of the present inventive concept.

FIG. 12 is a block diagram illustrating a memory card according to exemplary embodiments of the present inventive concept.

Referring to FIG. 12, a memory card 800 may include a controller 820 and a memory 830 in a housing 810. The controller 820 and the memory 830 may exchange an electric signal with each other. For example, the memory 830 and the controller 820 may exchange data with each other according to a command provided by the controller 820. The memory card 800 may store data in the memory 830 and/or may output data from the memory 830.

The controller 820 and/or the memory 830 may include one or more of the semiconductor packages in accordance with exemplary embodiments of the present inventive concept. For example, the controller 820 may include a system in package, and the memory 830 may include a multichip package. The controller 820 and/or the memory 830 may be a stacked package type. The memory card 800 may be a data storage medium for portable devices. For example, the memory card 800 may include a multi media card (MMC) or a secure digital (SD) card.

Figure 13:
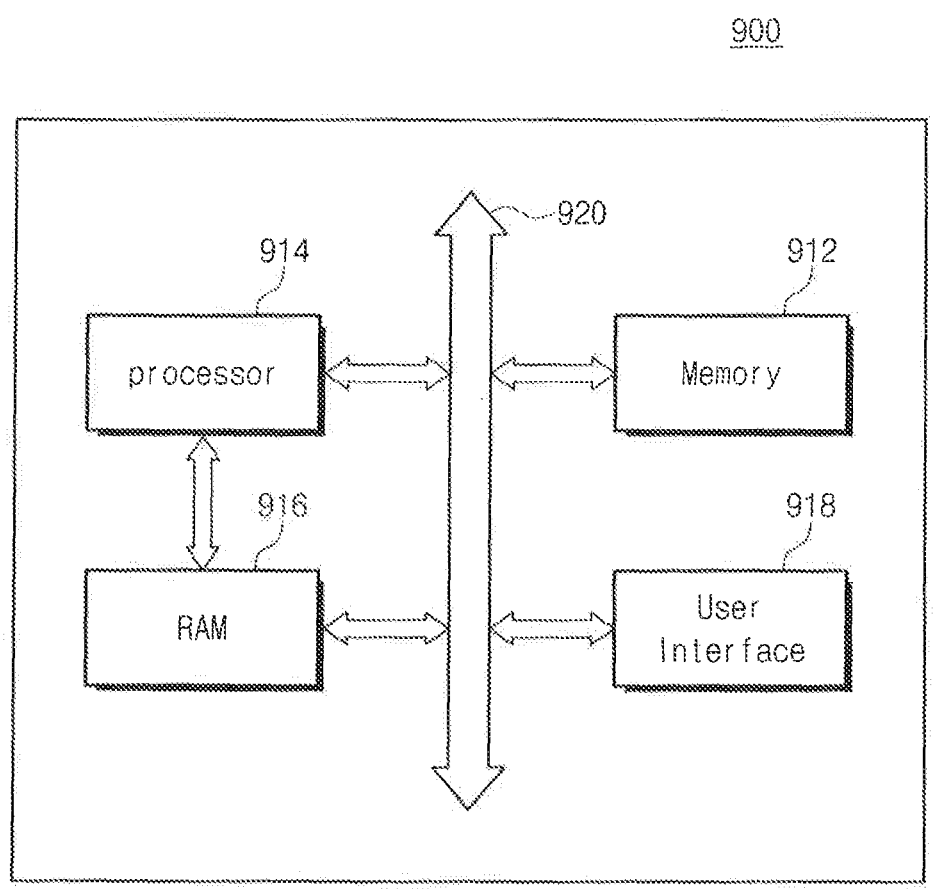
FIG. 13 is a block diagram illustrating an electronic system according to exemplary embodiments of the present inventive concept.

FIG. 13 is a block diagram illustrating an electronic system in accordance with exemplary embodiments of the present inventive concept.

Referring to FIG. 13, an electronic system 900 may include one or more semiconductor packages in accordance with an exemplary embodiment of the present inventive concept. The electronic system 900 may include a mobile device or a computer. For example, the electronic system 900 may include a memory storage device 912, a processor 914, a random access memory (RAM) 916, and a user interface 918 that can exchange data with one another using a bus 920. The processor 914 may execute a program and/or control the electronic system 900. The RAM 916 may be an operation memory of the processor 914. For example, the processor 914 and the RAM 916 may include a semiconductor package in accordance with exemplary embodiments of the present inventive concept. The processor 914 and the RAM 916 may be included in one package. The user interface 918 may input data to the electronic system 900 or output data from the electronic system 900. The memory storage device 912 may store program code for performing an operation of the processor 914, data processed by the processor 914, and/or data input from an external source. The memory storage device 912 may include a controller and/or a memory, and may be the same as or similar to the memory card 800 of FIG. 12.

Figure 14:
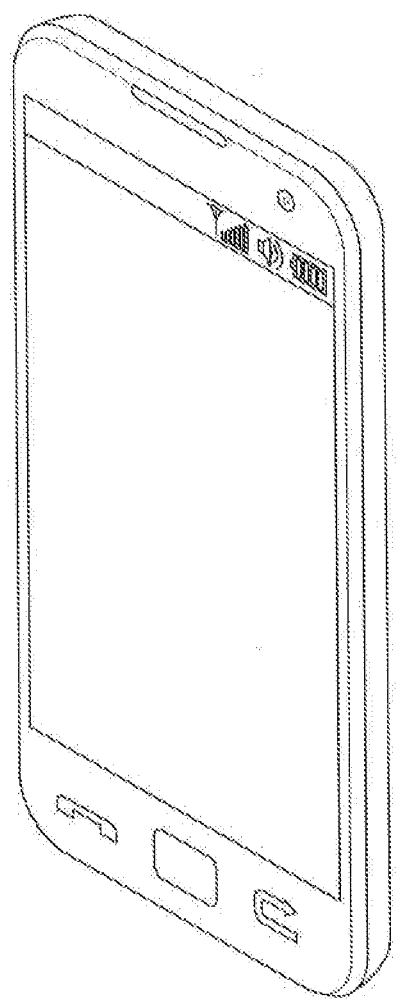
FIG. 14 is a perspective view illustrating an electronic device according to exemplary embodiments of the present inventive concept.

The electronic system 900 of FIG. 13 may be applied to various electronic devices. For example, as shown in FIG. 14, the electronic system 900 of FIG. 13 can be applied to a mobile phone 1000. According to exemplary embodiments of the present inventive concept, the electronic system 900 of FIG. 13 may be applied to a portable notebook computer, an MP3 player, a navigation system, a solid state disk (SSD), a vehicle, or home appliances.

According to exemplary embodiments of the present inventive concept, a process of mounting a semiconductor chip or a semiconductor package on a substrate or of stacking the semiconductor package on the semiconductor package may be performed using connection members that include a magnetic material. Warping or bending of the semiconductor package after a soldering process for forming the connection terminals may be reduced. The connection members may be in contact with each other, and may be disposed in each other, and thus, the semiconductor package may have increased structural stability. Reduced warpage of the semiconductor package may increase reliability, package yield, and usability of the semiconductor package.

While the inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A semiconductor package, comprising:
   a first semiconductor package including a lower wiring substrate and a first semiconductor chip disposed on the lower wiring substrate;
   a second semiconductor package disposed on the first semiconductor package, the second semiconductor package including an upper wiring substrate and a second semiconductor chip disposed on the upper wiring substrate; and
   first connection members disposed between the first and second semiconductor packages, the first connection members comprising first and second contact members each including one or more magnetic materials,
   wherein the first contact members comprise portions disposed in the second contact members, and
   wherein the one or more magnetic materials of the first contact members has an opposite polar orientation to the one or more magnetic materials of the second contact members.

2. The semiconductor package of claim 1, wherein the first connection members are disposed along sides of the lower wiring substrate or are disposed adjacent to corners of the lower wiring substrate, and wherein the corners are defined by adjacent sides of the lower wiring substrate.

3. The semiconductor package of claim 1, further comprising:
   a main board disposed below the lower wiring substrate; and
   second connection members disposed between the main board and the lower wiring substrate,
   wherein the main board is electrically connected to the lower wiring substrate via one or more outer connection terminals disposed on a bottom surface of the lower wiring substrate.

4. The semiconductor package of claim 3, wherein, the second connection members are in line with the first connection members when viewed in plan view.

5. The semiconductor package of claim 1, wherein the first semiconductor chip is a logic chip disposed on the lower wiring substrate in a flip-chip or wire-bonding manner, and
   the second semiconductor chip is a memory chip disposed on the upper wiring substrate in a flip-chip or wire-bonding manner.

* * * * *